(12) United States Patent
Onoshiro et al.

(10) Patent No.: US 6,911,101 B2
(45) Date of Patent: Jun. 28, 2005

(54) ACF TAPE FEEDER MACHINE, AND METHOD FOR FEEDING ACF TAPE

(75) Inventors: Jun Onoshiro, Tokyo (JP); Kenya Wada, Tokyo (JP); Ichiyo Ando, Tokyo (JP)

(73) Assignee: Hitachi High-Tech Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/613,005

(22) Filed: Jul. 7, 2003

(65) Prior Publication Data

US 2004/0069400 A1 Apr. 15, 2004

(30) Foreign Application Priority Data

Jul. 9, 2002 (JP) ........................................ 2002-200091

(51) Int. Cl.[7] .............................................. B32B 31/20
(52) U.S. Cl. ...................... 156/64; 156/157; 156/304.1; 156/361; 156/505; 156/507; 242/555.6
(58) Field of Search ............................... 156/64, 304.1, 156/157, 502, 507, 505, 361, 367, 362; 438/118, 119; 242/555.6

(56) References Cited

U.S. PATENT DOCUMENTS

| | | | | |
|---|---|---|---|---|
| 5,064,488 A | * | 11/1991 | Dickey | 156/159 |
| 5,643,395 A | * | 7/1997 | Hinton | 156/361 |
| 5,679,203 A | * | 10/1997 | Sakai | 156/344 |
| 6,189,587 B1 | * | 2/2001 | Cairns | 156/351 |

* cited by examiner

*Primary Examiner*—J. A. Lorengo
*Assistant Examiner*—George Koch
(74) *Attorney, Agent, or Firm*—Antonelli, Terry, Stout & Kraus, LLP

(57) ABSTRACT

From a supply reel which is set in position at an ACF (Anisotropic Concuctive Film) feeding station, an ACF tape having an ACF laminated on one side of a liner tape is drawn out by an ACF bonding means. At least two reel mount members are provided on a reel stand at the ACF feeding station to mount two ACF tape supply reels concurrently thereon. The reel stand is connected to a switch means thereby to switch the two reel mount members either to an operating or tape supplying position or a standby position. As soon as an ACF tape from a supply reel in the operating position is consumed completely, a fresh supply reel in the standby position is switched into the operating position to continue the supply of the ACF tape.

11 Claims, 12 Drawing Sheets

ACF TAPE FEEDER MACHINE, AND METHOD FOR FEEDING ACF TAPE

BACKGROUND OF THE INVENTION

1. Field of the Art

This invention relates to an ACF (Anisotropic Conductive Film) tape feeder machine and a method for feeding ACF tape, suitable for use in feeding and bonding ACF on substrate plates, for example, suitable for use in a liquid crystal display panel fabrication process for bonding ACF on a transparent substrate plate of a liquid crystal cell for the purpose of mounting driver electronics thereon.

2. Prior Art

For example, driver electronics including a plural number of IC devices are connected to at least two side edges of a transparent substrate of a liquid crystal display panel. In some cases, the driver electronics are constituted by IC devices themselves. In some cases, IC devices are mounted on a film substrate to constitute driver electronics parts to be mounted on a transparent substrate or to be connected between a transparent substrate and a printed circuit board.

No matter which mounting method is employed, it is difficult to use solder in connecting electrodes on the side of the driver electronics parts to electrodes on the side of the substrate, which are formed in an extremely fine pitch. Therefore, ACF has been resorted to in the art in order to electrically connect the electrodes on the side of the driver electronics to the electrodes on the side of the substrate in a secure and reliable manner. ACF has conductive particles or grains dispersed in a binder resin with sticky and electrically insulating properties. After bonding AFC on a transparent substrate, driver electronics parts are bonded thereon by a TAB (Tape Automated Bonding) operation, and heat and pressure are applied thereto to electrically connect the electrodes on the side of the TAB-mounted electronics parts to the electrodes on the side of the transparent substrate through the conductive particles in ACF.

Generally, ACF is laminated to a predetermined thickness on one side of a liner tape through a releasing layer. The AFC tape is wound on a supply reel, and a fore end portion of the AFC tape is drawn out from the supply reel and bonded on a transparent substrate by the use of a bonding means.

The AFC tape which is wound on a supply reel is limited in length. Therefore, as soon as an AFC tape supply reel is consumed completely, it has to be replaced by a fresh supply reel. At an AFC tape feeding station, a supply reel is set on a reel support shaft, and, when consumed completely, dismantled therefrom and replaced by a fresh supply reel. The reel replacing job is not completed simply by setting a fresh supply reel on the reel support shaft. It also involves a job of drawing out a fore end portion of the AFC tape on the newly set supply reel and connecting same to a bonding means. Namely, actually the reel replacement job involves a tape end connecting job in addition to reel replacement.

Heretofore, the reel replacing and tape end connecting jobs have relied on manual labor of an operator despite the fact that these jobs are troublesome and time consuming. Especially, since the ACF tape has an adhesive surface on one side, an operator is required to pay great attention not to touch the adhesive surface. Namely, the operator has to handle the ACF tape very carefully in reeling off a fore end portion of the ACF tape from a fresh supply reel and connecting same to a bonding means even if it takes a relatively long period of time.

Of course, the operation of mounting driver electronics parts on a substrate is suspended during the reel replacement and the tape end connecting operation, resulting in great time losses. Besides, in order to minimize the time losses, the operator needs to watch the progress of a tape feeding operation and to replace a supply reel by a fresh one in a good timing, that is to say, as soon as the tape from one reel is completely consumed. Accordingly, the operator has to stand by exclusively for this purpose from well before a time point when tape supply from a currently operating supply reel comes to an end. As a result, the operational efficiency is deteriorated considerably by the reel replacements because the operator cannot do other jobs during each standby period.

Especially, as a result of recent progresses and improvements in automatic mounting apparatus for electronic circuitry parts, there has been a trend toward speeding up the tact time of electronic parts mounting operations, consuming the ACF tape of each supply reel in a shortened period of time and as a result necessitating to replace the supply reel at a higher frequency. It is a paramount requisite to shorten the time period of the reel replacements in order to shorten a time period for mounting each electronic part.

SUMMARY OF THE INVENTION

In view of the foregoing situations, it is an object of the present invention to make it possible to replace an empty ACF tape supply reel by a fresh reel and to connect a fore end portion of an ACF tape from the fresh supply reel to a bonding means of an ACF tape feeder machine quickly and smoothly, permitting to set a fresh supply reel in a stand by position at any time or in an arbitrary timing, irrespective of the progress of a current tape feeding operation.

It is another object of the present invention to make it possible to carry out a reel replacing job and a tape end connecting job separately in different timings, permitting to carry out a reel replacing job concurrently or in overlapped relation with an ACF tape feeding operation from other supply reel.

It is still another object of the present invention to make it possible to shorten the time for reel replacements and to permit an uninterrupted ACF taple feeding operation by the use of ACF tape supply reels each loaded with a limited length of ACF tape.

In accordance with the present invention, in order to achieve the above-stated objectives, there is provided an ACF (Anisotropic Conductive Film) tape feeder machine having an ACF bonding means adapted to draw out an ACF tape, with an ACF laminated on a liner tape, from a supply reel set in a feed position at an ACF tape feeding station, and to bond the ACF on substrate plate surfaces one after another over a predetermined length, characterized in that: the ACF tape feeding station is provided with a reel stand having at least two reel mount members for setting at least two ACF tape supply reels separately thereon; the reel mount members of the reel stand are connected to a switch means and switchable to and from an operating position for reeling out the ACF tape to the bonding means and a standby position.

Further, according to the present invention, there is also provided a method for feeding an ACF tape, comprising the steps of; providing at least two reel support members on a reel stand to support and set at least two ACF tape supply reels thereon, one in an operating position for reeling off an ACF tape and the other one in a standby positon; while an ACF tape from a supply reel in the operating position is being bonded on substrate plates by the use of a bonding means, replacing an empty supply reel in the standby position by a fresh ACF tape supply reel; as soon as the ACF tape supply reel in the operating position becomes empty, switching positions of the reel mount members to locate the reel mount member with the fresh ACF tape supply reel in the operating position; and drawing out an ACF tape from the fresh reel and connecting the same to said bonding means.

In this instance, the tape supply reels are set on reel mount members which are provided on a reel stand. Each one of the reel mount members is provided with at least one reel support shaft. Further, in order to make an automatic tape end connecting operation feasible, a tape end holder member is provided on each reel mount member thereby to grip a fore end of an ACF tape which is reeled off from a supply reel over a predetermined length. Alternatively, the tape end holder member may be arranged into the so-called cassette type which is provided integrally with the tape supply reel. In a case where a tape supply reel is mounted directly on a reel support shaft, the tape end holder member is provided on each one of the reel mount members of the reel stand. Otherwise, an adhesive medium may be used for holding a fore end portion of an ACF tape on the reel mount member. It is also possible to employ a chuck means for this purpose. Furthermore, the end holder member can be arranged to grip the liner tape smoothly. In this regard, it is preferable to employ a suction type end holder member because it is simple in construction and capable of holding and releasing a tape by smooth actions. A fore end portion of the ACF tape, which is gripped by the tape end holder member, has to be handed over to the bonding means. In a case where the tape end holder member is constituted by a mechanical chuck means, the handover can be made directly. However, it is also possible to provide a tape handover means which is arranged in such a way as to pick up an ACF tape from the tape end holder member on the tape supplying side and then hand over the tape to the bonding means.

As for the bonding means, it is possible to employ various mechanisms and systems which have been known in the art. For example, the bonding means can be largely constituted by a chuck member which is adapted to grip a fore end portion of ACF tape, a bonding roller adapted to press an ACF tape from above to bond an ACF side of the tape against a substrate plate. In this case, the bonding means is movable on and along a substrate plate. The liner tape of the AFC tape has to be peeled off after bonding the AFC on a substrate plate. Therefore, it is desirable to provide a peeler roller on the bonding means. In a case where the bonding means is provided with a chuck member for gripping a fore end portion of ACF tape, the tape handover means should preferably include a handover chuck member which is adapted to pick up an ACF tape from the tape end holder member and then hand it over to the chuck member of the bonding means.

The reel stand which supports the two reel mount members is connected to a switch means thereby to switch the reel mount members to and from an operating or tape supply position and a standby position. Therefore, each reel mount member is provided with a reel support shaft and a tape end holder member thereon. The two reel mount members are switched alternately from the operating to standby position and from the standby to operating position in an interlinked manner. In switching the positions of the reel mount members, they may be displaced in vertical or lateral directions. However, in order to replace supply reels constantly at the same position, it is preferred to couple the reel stand with a rotational shaft and to turn one of the reel mount members on the reel stand selectively into the operating position by turning the rotational shaft back and forth through a predetermined angle, for example, through 180 degrees. One supply reel is set in the operating or tape feeding position, while one or a plural number of supply reels may be set in a standby position or positions. For example, four reel mount members may be provided on an indexing rotational shaft with a positional phase difference of 90 degrees from each other. In this case, the supply reels on the four reel mount members are successively advanced into an operating position by an indexing rotation as soon as a supply reel in a preceding position is consumed completely, that is to say, three supply reels are held in standby positions while one supply reel is in the tape supplying operation.

The above and other objects, features and advantages of the present invention will become apparent from the follow particular description, taken in conjunction with the accompanying drawings which show by way of example some preferred embodiments of the invention. Needless to say, the present invention is not limited to the particular forms which are shown in the accompanying drawings for illustrative purposes.

DESCRIPTION OF PREFERRED EMBODIMENTS

Hereafter, the present invention is described more particularly by way of its preferred embodiment shown in the accompanying drawings. Firstly, reference is had to the outer view of a liquid crystal cell in FIG. 1, the sectional view of a TAB mount portion in FIG. 2, and the sectional view of ACF tape in FIG. 3.

Figure 1:
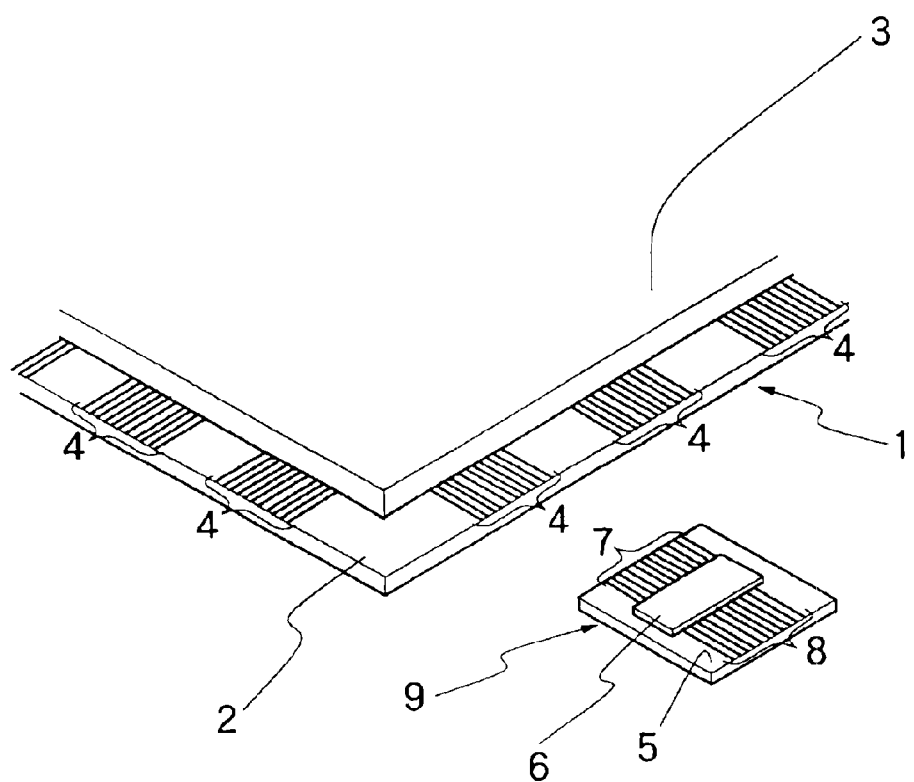
FIG. 1 is a fragmentary outer view of a liquid crystal display panel, shown as an example of application of an AFC feeder (bonding) machine according to the present invention.

In FIG. 1, the liquid crystal cell 1 has liquid crystal sealed in a cell gap which is formed between two overlapped transparent substrate plates, for example, between two substrate plates of glass. Here, the two substrate plates 2 and 3 which constitute the liquid crystal cell 1 are referred to as a lower substrate 2 and an upper substrate 3, respectively. Electrode patterns are formed on confronting inner surfaces of the lower and upper substrate plates 2 and 3 by printing or other suitable means, in groups each consisting of a plural number of electrodes as indicated by reference numeral 4. In the case of the lower substrate plate 2, for instance, groups of electrodes 4 are formed along at least two sides thereof. Each electrode group 4 of the lower substrate plate 2 is electrically connected to a group of electrodes 7 on the side of a driver electronics part 9 having an IC device 6 mounted on a wiring board film 5 and having electrode groups 7 and 8 of a predetermined number formed on the opposite sides of the IC device 6.

Figure 2:
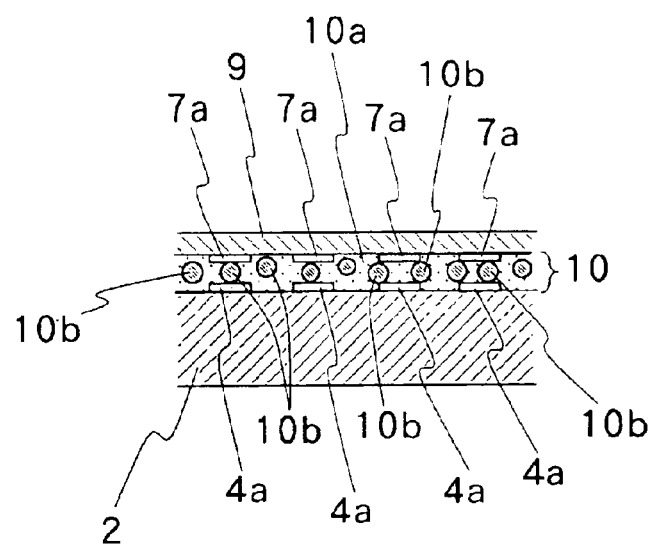
FIG. 2 is a schematic sectional view of a TAB mount portion of a liquid crystal display panel.
Figure 3:
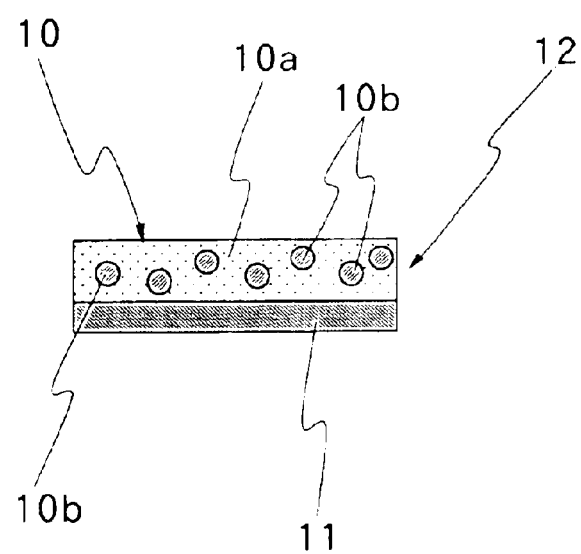
FIG. 3 is a schematic sectional view of an ACF tape.

An ACF tape 10 is used for mounting the driver electronics part 9 11 on the lower substrate plate 2 with the electrode group 7 on the side of the driver in an electrically connected state the electrode group 4 on the side of the substrate plate. As seen in FIGS. 2 and 3, ACF has conductive particles 10b uniformly dispersed in a binder resin material 10a with sticky and electrically insulating properties. The conductive particles are smaller in size than the intervals between individual electrodes in the electrode group 7 on the side of the driver and in the electrode group 4 on the side of the substrate plate. The ACF is interposed between the lower substrate plate 2 and the driver electronics part 9, and, after softening the binder resin 10a, pressure is applied to the lower substrate 2 and the driver electronics part 9, reducing the thickness of the ACF 10 almost to the grain size of the conductive particles 10b and thereby bringing the conductive particles into contact with electrodes 4a and 7a of the electrode group 4 on the side of the substrate plate and the electrode group 7 on the side of the driver to establish electrical connections therebetween. Upon hardening the binder resin 10a, the driver electronics part 9 is securely fixed to the lower substrate plate 2.

As clear from FIG. 3, ACF 10 is laminated on a liner tape 11 and provided in the form of an ACF tape 12. The laminated layer of ACF 10 is releasable from the liner tape 11. Therefore, the liner tape 11 can be peeled off when the ACF 10 is bonded on and fixed to the lower substrate plate 2. As a result, the ACF layer 10 of the ACF tape 12 is bonded on the lower substrate plate 2.

Figure 4:
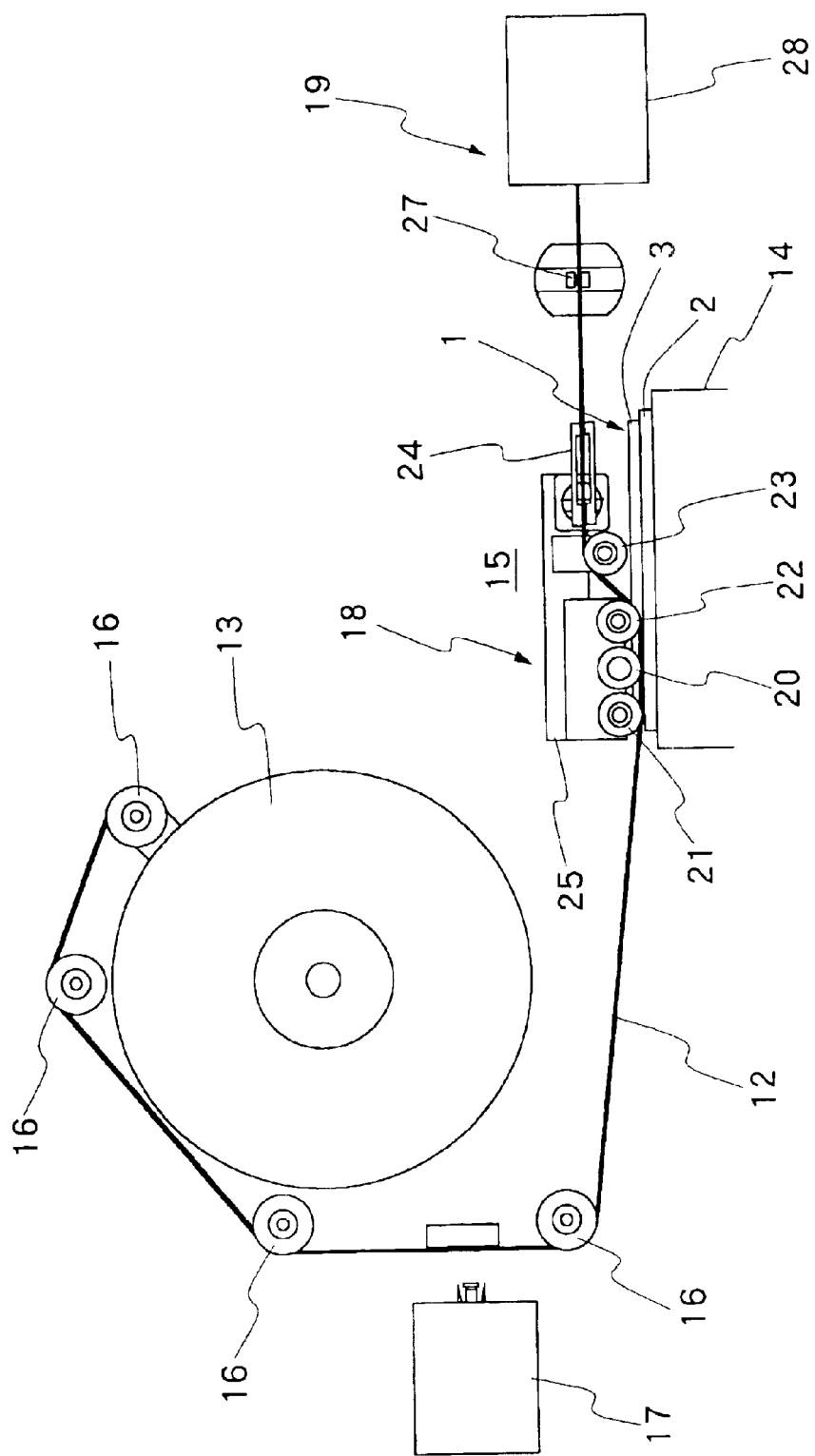
FIG. 4 is a schematic illustration of an ACF bonding machine according to the present invention.

As shown in FIG. 4, the ACF tape 12 is wound on a supply reel 13, and reeled off therefrom and bonded on the lower substrate plate 2. The liquid crystal cell 1 is mounted on a carriage table 14 with a positioning mechanism, and delivered to an ACF bonding station 15. Guide rollers 16 are provided at suitable positions along a tape supply route to be taken by the ACF tape 12 from the supply reel 13. These guide rollers 16 are held in engagement with the ACF tape 12 on the side of the liner tape 11.

Provided in the course of a tape supply route, taken by an ACF tape which has been drawn out by the guide rollers 16, is a half cutter means 17 which serves to remove the ACF 10 over a predetermined length and at predetermined intervals.

Figure 5:
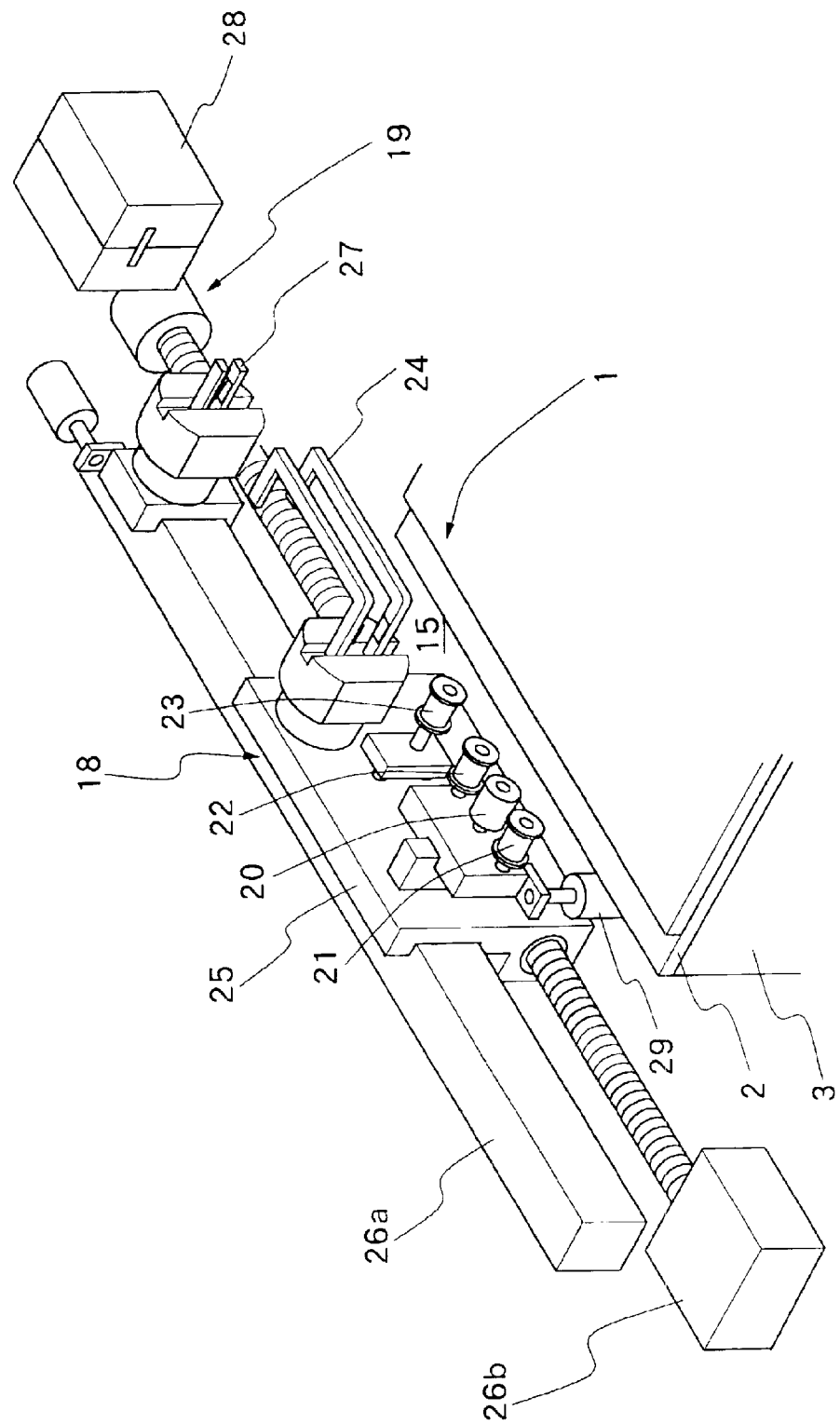
FIG. 5 is a perspective view of a bonding unit and a peeling chuck.

Further, in FIG. 4, shown at 18 is a bonding means and at 19 a collecting means. The bonding means 18 is composed of a roller assembly unit including a bonding roller 20, guide rollers 21 and 22 which are located on the upstream and downstream sides of the bonding roller 20 and a peeling roller 23, and a drawing chuck member 24. All of just-members are mounted on a carriage block 25. As seen in FIG. 5, the carriage block 25 is moved back and forth by a horizontal transfer unit, including a guide rail 26a and a drive means 26b, to reciprocate to and from predetermined initial and end positions. The carriage block 25 can be stopped at any aimed position in the course of its horizontal stroke. The collecting means 19 is provided for collecting the liner tape 11 which is peeled off the ACF 10 after bonding the latter on the lower substrate plate 2, and composed of a peeling chuck member 27 and a collecting box 28. The collecting box 28 is adapted to collect the peeled liner tape 11 by suction force.

The bonding roller 20 and the guide rollers 21 and 22 of the bonding means 18 mounted on a lift means 29 and thereby moved to and from a lower position at which the ACF tape is brought into abutting engagement with the lower substrate plate 2 and an upper receded position away from the lower substrate plate 2. The peeler roller 23 which is located downstream of the bonding roller 20 in the travel direction of the ACF tape 12 is fixedly retained in position in the vertical direction. Opened between the guide roller 22 and the peeler roller 23 is a gap space to permit passage of a handover chuck member 46 which will be described hereinlater.

The ACF bonding machine is generally arranged as described above. The carriage block 25 is located at an initial position in the proximity of the supply reel 13. At the initial position, the ACF tape 12 is gripped by the drawing chuck member 24, and, while the ACF tape 12 is being gripped by the drawing chuck member 24, a bonding operation is started from this position to bond ACF 10 on the lower substrate plate 2 of the liquid crystal cell 1. In this instance, by the half cut means 17, ACF 10 has been peeled off from the chuck portion of the ACF tape 12 to be gripped by the drawing chuck member 24. Thus, it is the liner tape 11 that is actually gripped by the drawing chuck member 24, and there is no possibility of the drawing chuck member 24 coming into direct contact with ACF 10.

The carriage block 25 is moved forward to a bonding start position where the bonding roller 20 starts to bond ACF 10 on the lower substrate 2 of the liquid crystal cell 1. Then, the lift means 29 is actuated to lower the bonding roller 20 and the front and rear guide rollers 21 and 22 until the ACF tape 12 is abutted on the lower substrate plate 2. At this time, normally the carriage block 25 is temporarily held at rest. However, if desired, the lift means may be actuated during movement of the carriage block 25. The carriage block 25 is then put in travel, letting the bonding roller 20 and the front and rear guide rollers 21 and 22 move along the surface of the lower substrate plate 2. At this time, by the bonding roller 20, ACF 10 of the ACF tape 12 is bonded on the lower substrate plate 2 under a predetermined pressure.

As soon as the bonding roller 20 is displaced to an end position of the ACF bonding operation on the lower substrate 2, the carriage block 25 is stopped. Then, the peeling chuck member 27 is actuated to grip the ACF tape 12. Since the ACF 10 had already been peeled off at a position forward of the bonding means 18, at this time it is the liner tape 11 that is gripped by the peeling chuck member 27. After this, the drawing chuck member 24 is opened to release the ACF tape 12. In this state, the carriage block 25 is moved toward the initial position. The peeler roller 23 is engaged with that side of the liner tape 11 where a releasing layer is formed, and located in a spaced position from the lower substrate plate 2. Therefore, the liner tape 11 is peeled off ACF 10 which has been bonded to the lower substrate plate 2. As soon as ACF 10 is completely separated from the liner tape 11, the bonding roller 20 and the guide rollers 21 and 22 are lifted up by the lift means 29, and then the drawing chuck member 24 is closed to grip the liner tape 11 which has been separated from the bonded ACF 10, and at the same time the peeling chuck member 27 is opened to release the tape.

After the above operation, the machine becomes ready for starting an ACF bonding operation on a next liquid crystal cell 1. Therefore, as soon as a fresh liquid crystal cell 1 is delivered on the transfer table 14, the machine is operated to repeat the above-described operation. As the carriage block 25 is moved to reel off the ACF tape 12 and the ACF 10 is bonded by the bonding roller 20, the peeled and used portion of the liner tape 11 is fed forward and collected into the collecting box 28 by suction force.

As the ACF bonding operation is repeated continuously, sooner or later the ACF tape 12 on the supply reel 13 is totally consumed. In order to continue the bonding operation, the consumed supply reel has to be removed and replaced by a fresh supply reel. At time time, after setting a fresh supply reel in position at the tape feeding station, it becomes necessary to draw out a fore end of an ACF tape 12 from the fresh reel as far as the bonding means 18 and to chuck it on the drawing chuck member 24. According to the present invention, the reel replacing and the tape end connecting operations can be completed very smoothly. By nature, the reel replacement and the tape end connection are different jobs. Namely, what is involved are a job of replacing a consumed reel by a fresh reel, and a job of drawing a fore end of an ACF tape 12 from the fresh reel and getting the fore tape end chucked on the drawing chuck member 24 of the bonding mechanism 18. Therefore, the jobs for the reel replacement and the tape end chucking are performed in different timings and by the use of different means.

The fore end of the ACF tape can be connected either by drawing out the fore end of the ACF tape 12 from the supply reel 13 until it reaches the drawing chuck member 24 of the bonding mechanism or by drawing out a fore end of the ACF tape 12 of the reel 13 to a predetermined position and then moving the drawing chuck member 24 toward that position to grip the fore end of the ACF tape 12. This tape connecting operation can be performed automatically. Besides, by nature, the tape connecting operation cannot be carried out until a currently used supply reel is completely consumed to an empty state, that is to say, the tape connecting operation has to be carried out in a timing which is restricted by operating conditions of the ACF bonding machine.

On the other hand, automation of the reel replacements is also possible but for this purpose it becomes necessary to install a robot or the like for automatically performing the jobs removing an empty reel and setting a fresh supply reel in position, in addition to the necessity for providing a place for stocking fresh reels. Therefore, an automatic ACF bonding machine necessarily becomes complicated in construction and larger in scale. Further, the robot is required to perform operations which involve extremely complicated actions. Therefore, it is more rational to replace tape supply reels anually by an operator. Besides, if a fresh supply reel can be held in a standby desired timing, irrespective of operating conditions of the ACF bonding position, it becomes possible to replace tape supply reels at any time machine.

Figure 6:
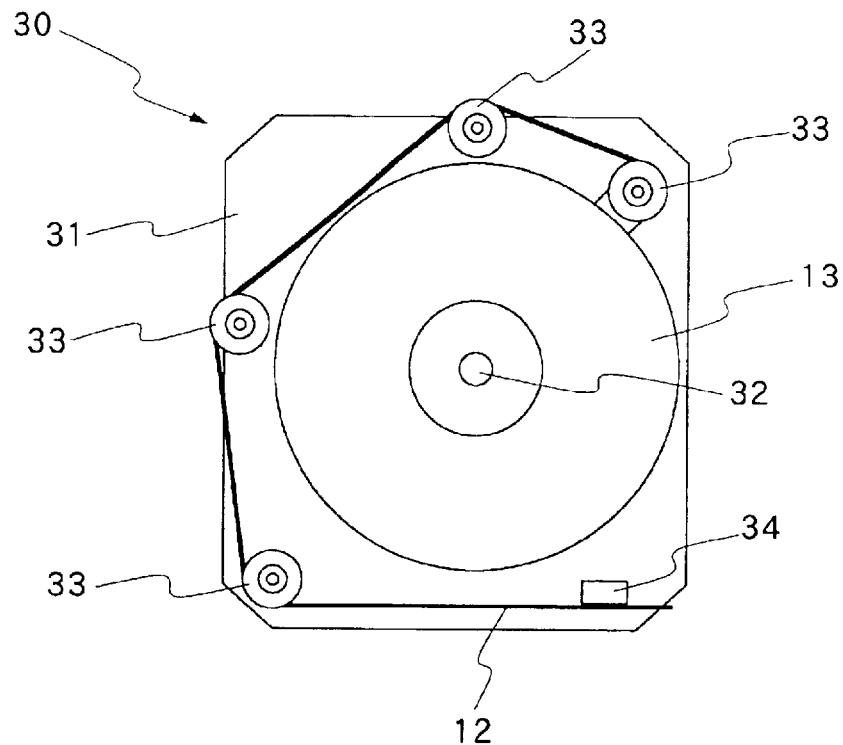
FIG. 6 is a schematic front view of a reel stand.
Figure 7:
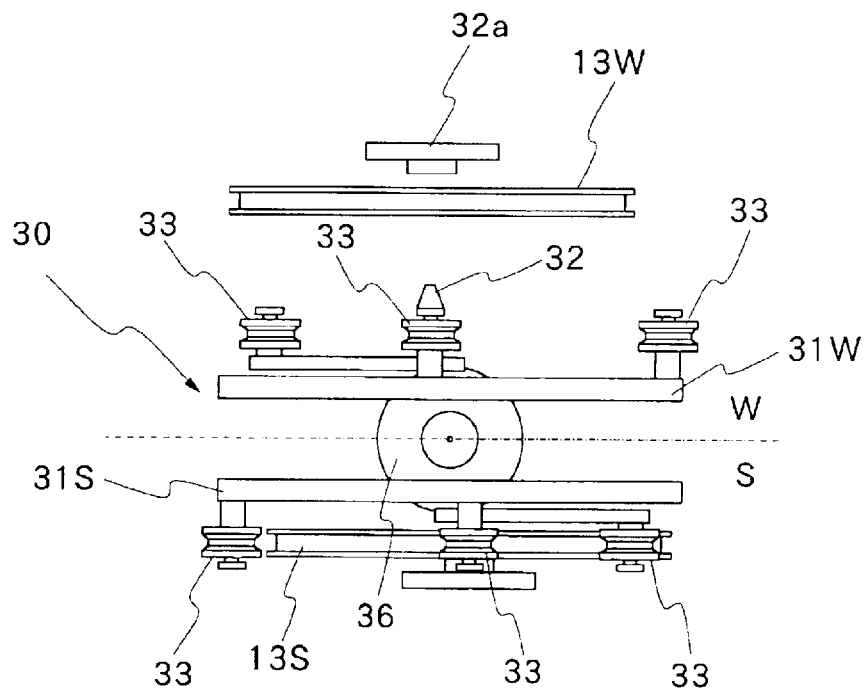
FIG. 7 is a schematic plan view of the reel stand in an operational phase of replacing a supply reel in a standby position.

In order to permit replacements of tape supply reels in a more casual or arbitrary timing, a supply reel stand 30 is arranged to support a couple of supply reels 13 thereon as shown in FIGS. 6 and 7. The supply reel stand 30 is largely constituted by an upright reel mount member 31, reel support shafts 32 provided on the opposite sides of the reel mount member 31 and adapted to support a tape supply reel 13 thereon, and guide rollers 33 (corresponding to guide rollers 16 in FIG. 4) provided on each side of the reel mount member 31 to guide an ACF tape which is reeled off from the tape supply reel 13. Further, a tape end holder member 34 is provided substantially at a foremost position in a tape travel path which is formed on the reel mount member 31 by the guide rollers 33. In this instance, the tape end holder member 34 is provided with a suction hole 35 on the lower side thereof to grip a front side of a liner tape 11 by suction force.

As shown in FIG. 7, a pair of reel mount members 31 are supported on a reversing shaft 36 with 180 degrees phase difference from each other. Each one of these reel mount members 31 is securely fixed to the reversing shaft 36 on the back side, that is to say, on the side away from the front side on which the tape supply reel 13 is supported. This reversing shaft 36 is rotated back and forth through 180 degrees by a drive means which is not shown.

In the case of the particular embodiment shown in FIG. 7, the side labeled with "S" is a supply side which is being by a reel 13 currently in operation for supplying the ACF tape 12, and the side labeled with "W" is a side being used by a fresh supply reel which is held in a standby state until the ACF tape 12 of the tape supply reel 13 on the other side "S" is completely consumed. Namely, in FIG. 7, a letter "S" or "W" is affixed to the reference numerals to distinguish the reel mount member and the tape supply reel on the supply side "S" from the counterparts on the standby side "W". Further, the standby side "W" which is used for reel replacements is now in the process of reel replacement in FIG. 7.

A consumed reel is replaced by a fresh reel in the manner as described below. For this purpose, a reel replacing operation is started with removal of a stopper 32a which is detachably fixed on the reel support shaft 32 on the side of the reel mount member 31W, as shown in FIG. 7. Then, an empty reel is removed, and a fresh reel 13W is set in position on the reel support shaft 32 and locked in that position by attaching the stopper 32a again to the reel support shaft 32. Before or at this stage of replacement, the ACF 10 is peeled off the fore distal end of the ACF tape 12 from the reel 13W over a predetermined length. Thereafter, the AFC tape 12 is reeled off from the supply reel 13W along the tape travel path around the guide rollers 33 on the reel mount member 31 until the fore end of the tape is sucked and gripped by the suction hole 35 of the tape end holder member 34.

One cycle of reel replacing operation is completed by the above described operations. Even during this reel replacing operation, the supply of the ACF tape 12 from the tape supply reel 13 on the reel mount member 31S on the currently supplying side "S" is continued without being influenced by the reel replacement. Namely, the reel replacement can be carried out at any time point during a time period between start and end of the supply of the ACF tape 12 from the supply reel 13 on the side of the reel mount member 31S. Accordingly, an operator can replace reels at any time and in an arbitrary timing. This means that the operator is no longer required to waste time for standing by and waiting for appropriate timings of reel replacements. In addition, supply reels can be replaced quickly in a facilitated manner, contributing to enhance the working efficiency of the operator all the more.

Figure 8:
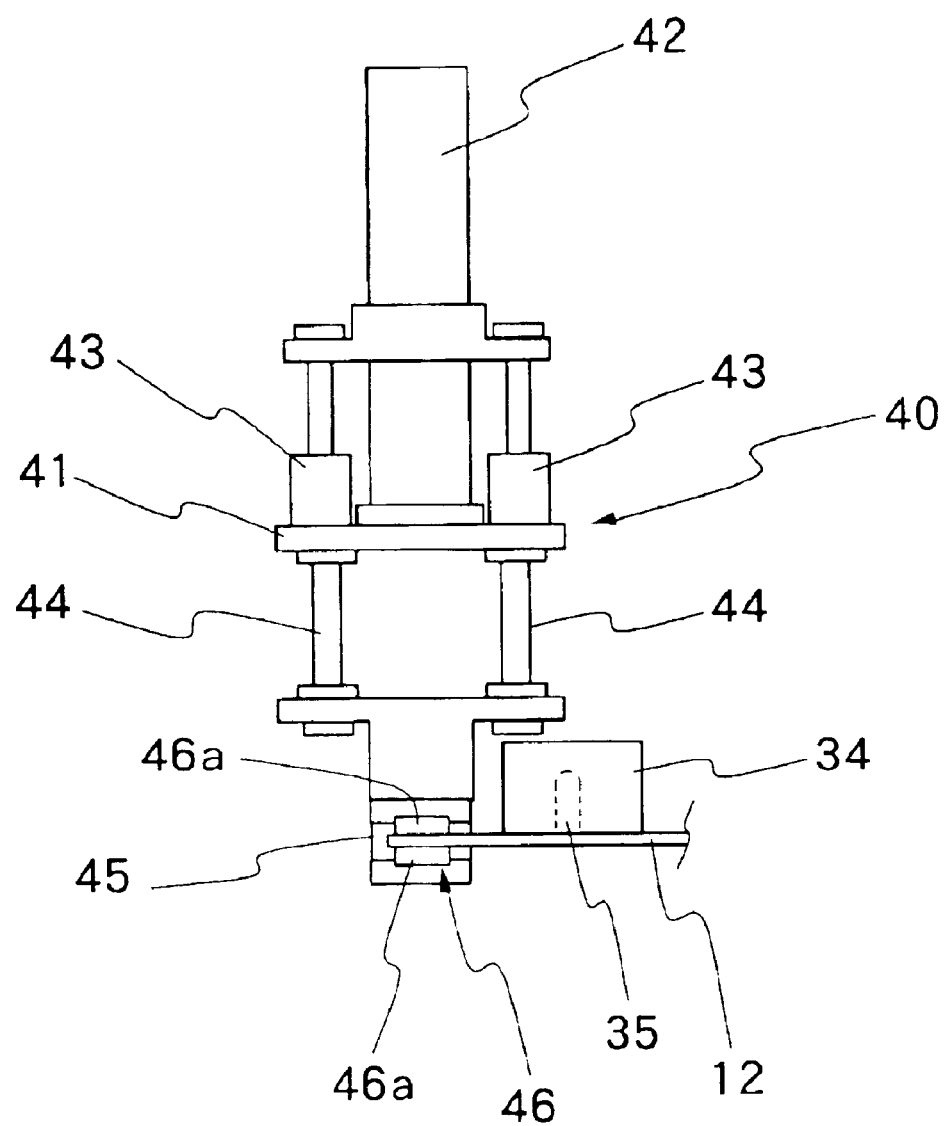
FIG. 8 is a schematic illustration of a tape handover means.

The supply of the ACF tape 12 from the tape supplying side "S" is continued even after the supply reel 13W is set in position on the reel mount member 31W on the standby side "W". As soon as all of the ACF tape 12 on the reel 13S on the reel mount member 31S on the tape supplying side "S" is used up and collected in the collection box 28, this is detected by a sensor (not shown), and, in response to a signal from the sensor, the reversing shaft 36 is turned around to reverse the positions of the reel mount members on the tape supplying side "S" and the standby side "W", turning the tape supply reel 13S on the reel mount member 31S into the position on the standby side "W" while turning the tape supply reel 13W on the reel mount member 31W into the position on the tape supplying side "S". Accordingly, after the reversal of reel positions, the reel mount member 31S operates as the reel mount member 31W on the standby side "W" while the reel mount member 31W operates as the reel mount member 31S on the supplying side "S". However, in this state, it is not yet possible to supply the ACF tape 12 from the supply reel 13S which has been turned into the tape supplying side "S". The fore end of the ACF tape 12 has to be connected to the drawing chuck member by a tape end connecting operation. In order to perform this tape end connecting operation automatically, the bonding machine is provided with a tape handover means 40 as shown in FIGS. 8 and 9.

The tape handover means 40 is provided with a support member 41 which is located fixedly at a position which will not interfere with reversing actions of the reel stand 30, travel path of the ACF tape 12 which is fed out from the supply reel 13, and operational actions of the bonding means 18. Mounted on the support member 41 are a lift drive cylinder 42, a couple of slide guides 43, and a couple of support rods 44 which are driven up and down by the cylinder 42 and respectively guided by the slide guides 43. An actuator 45 is attached to the lower ends of the support rods 44 thereby to open and close a handover chuck member 46.

Figure 9:
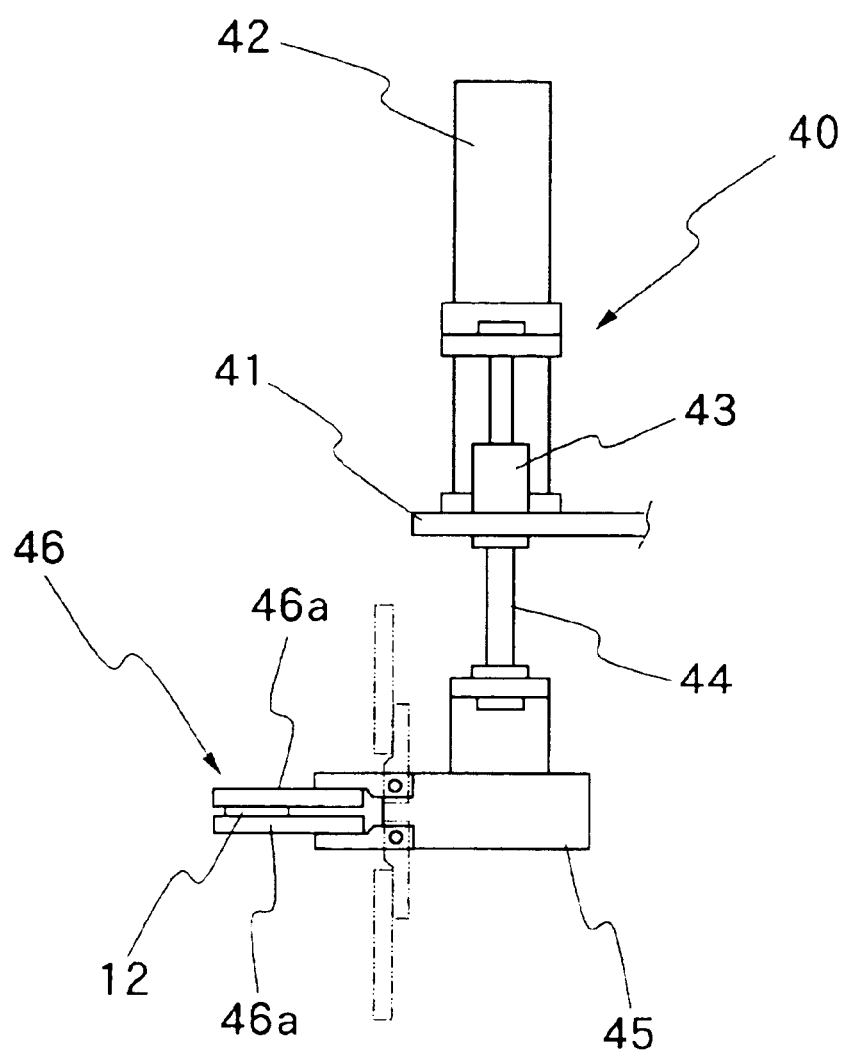
FIG. 9 is a schematic side view of the tape handover means of FIG. 8.
Figure 10:
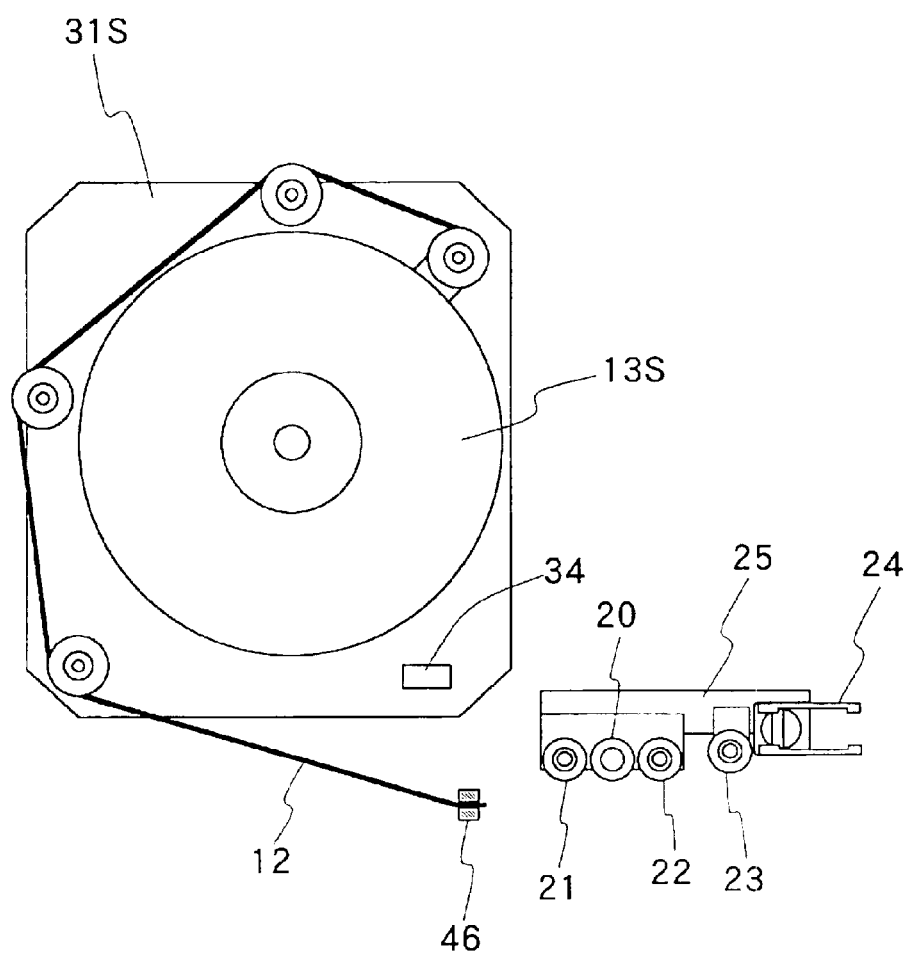
FIG. 10 is a schematic illustration explanatory of a first step of an ACF tape end connecting operation.

Thus, as the handover chuck member 46 is closed by the actuator 45, the ACF tape 12 is gripped between the upper and lower chuck portions 46a as indicated by solid line in FIG. 9. On the contrary, when the handover chuck member 46 is opened, the upper and lower chuck portions 46a are swung open in the upward and downward directions, respectively, as indicated in phantom in FIG. 9 to take receded positions away from the travel path of the ACF tape 12. The support rods 44, which support the assembly of the handover chuck member and the actuator 45, is movable at least to and from an upper lifted position, a lowered position and at least one intermediate position.

By operation of the tape handover means 40 with the above-described arrangements, the fore end of the ACF tape 12 which is gripped by the tape end holder member 34 can be drawn out from the supply reel 13 and handed over to the drawing chuck member 24 of the bonding means 18. In this instance, the ACF tape 12 is passed on the lower side of the bonding roller 20 and the front and rear guide rollers 21 and 22 and on the upper side of the peeler roller 23, and gripped in the drawing chuck member 24. Namely, by operation of the tape handover means 40, the fore end of the ACF tape 12 is routed under and over the respective rollers in the manner just described, and handed over to the drawing chuck member 24 automatically without relying on manual labor.

Now, the handover operation is explained with reference to FIGS. 10 through 14. In the first place, the handover chuck member 46 of the tape handover means 40, which is in an opened state, is located in a position at the same height with the ACF tape 12 which is sucked on the tape end holder member 34 on the reel stand 30. Then, the reversing shaft 36 is rotated through 180 degrees to reverse the positions of the two reel mount members, and, the handover chuck member 46 is actuated to grip the fore end of the ACF tape 12 which has been sucked on the tape end holder member 34 on the reel mount member 31S of the tape supplying side "S". At this time, the liner tape 11 alone is gripped by the handover chuck member 46 because the ACF 10 has already been peeled off from that portion of the ACF tape 12. The suction grip of the tape end holder member 34 is then turned off to release the ACF tape 12.

As soon as the ACF tape 12 is gripped and fetched by the handover chuck member 46, the cylinder 42 is actuated to lower the handover chuck member 46. At a lowered position, the ACF tape 12 is located at a level lower than the bonding roller 20 and the front and rear guide rollers 21 and 22 of the bonding means 18, as seen particularly in FIG. 10. From the position shown in FIG. 10, the carriage block 25 of the bonding means 18 is moved in the leftward direction in that figure, that is to say, in the backward direction relative to the travel direction of the ACF tape 12 to bring the handover chuck member 46 to a position between the guide roller 22 and the peeler roller 23, as shown particularly in FIG. 11.

Figure 11:
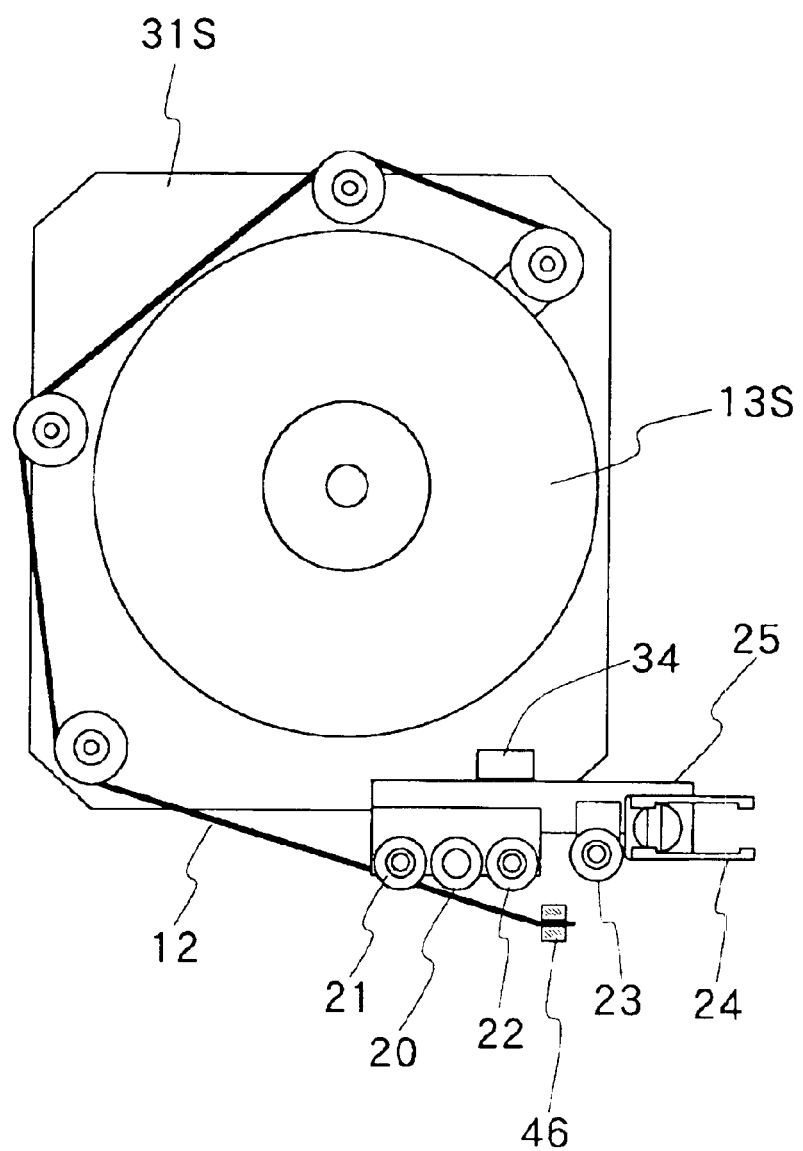
FIG. 11 is a schematic illustration explanatory of a second step of the ACF tape end connecting operation.
Figure 12:
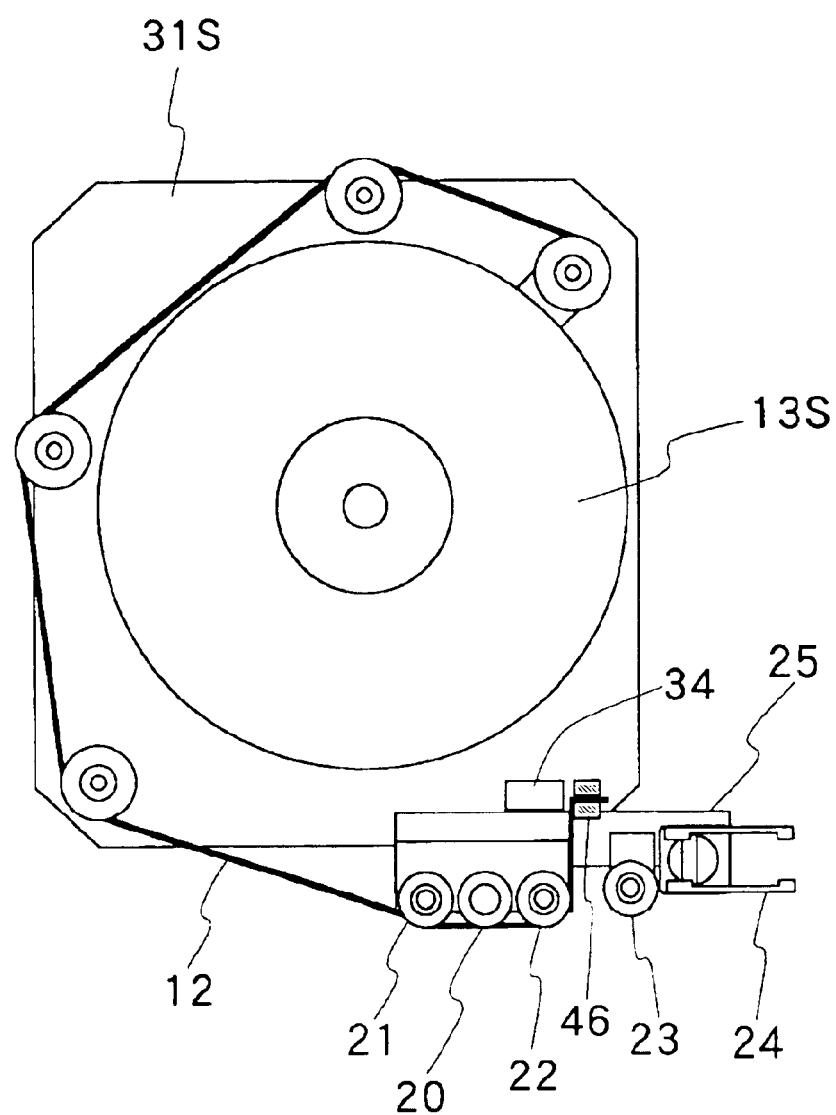
FIG. 12 is a schematic illustration explanatory of a third step of the ACF tape end connecting operation.
Figure 13:
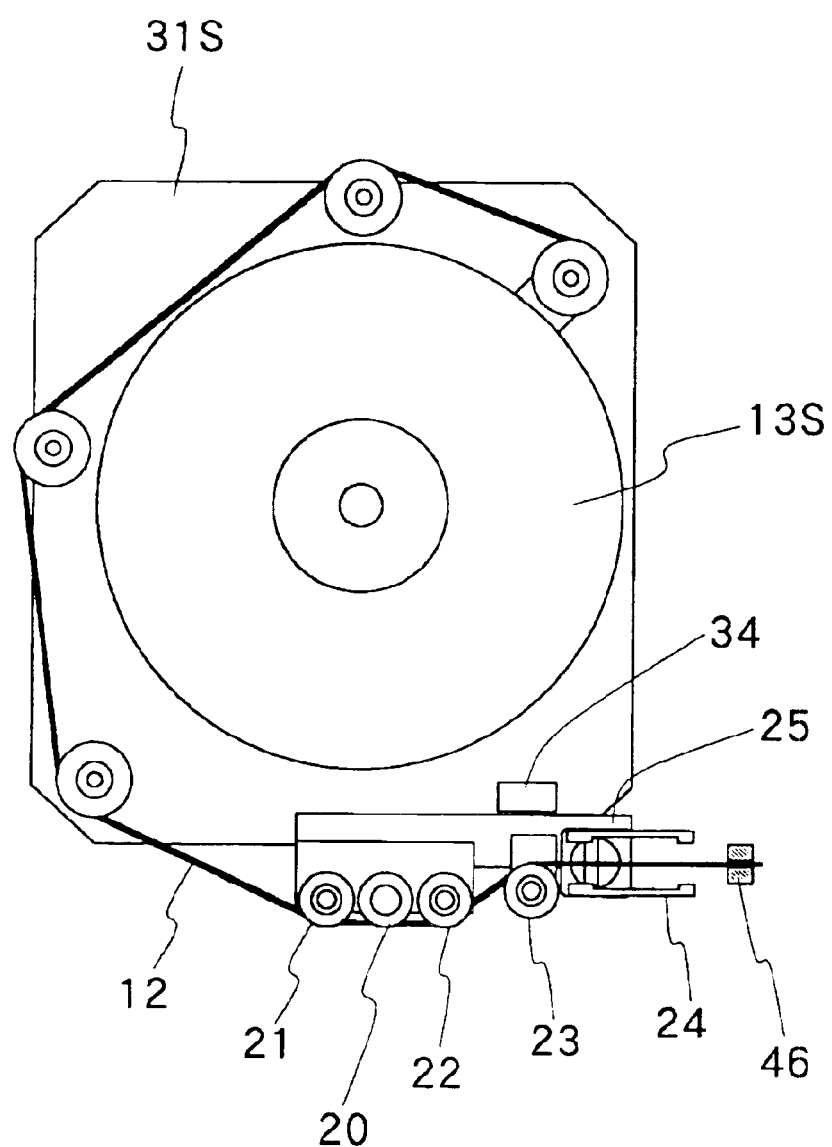
FIG. 13 is a schematic illustration explanatory of a fourth step of the ACF tape end connecting operation.

The handover chuck member 46, in the position of FIG. 11, is then moved upward into an upper lifted position whereupon the ACF tape 12 is oriented to run along the lower side of the bonding roller 20 and the front and rear guide rollers 21 and 22 and then rise to a level over the peeler roller 23 as shown particularly in FIG. 12. Thereafter, the carriage block 25 is moved further in the leftward direction, displacing the peeler roller 23 forward past the position of the handover chuck member 46 and relocating the drawing chuck member 24 at a position forward of the handover chuck member 46. At this time, the drawing chuck member 24 of the bonding means 18 is retained in an opened state, and the handover chuck member 46 is lowered to a position at an intermediate level between the upper and lower chuck portions of the drawing chuck member 24. In this state, the carriage block 25 is moved further in the leftward direction, whereupon the handover chuck member 46 is passed through the drawing chuck member 24 as shown particularly in FIG. 13.

Figure 14:
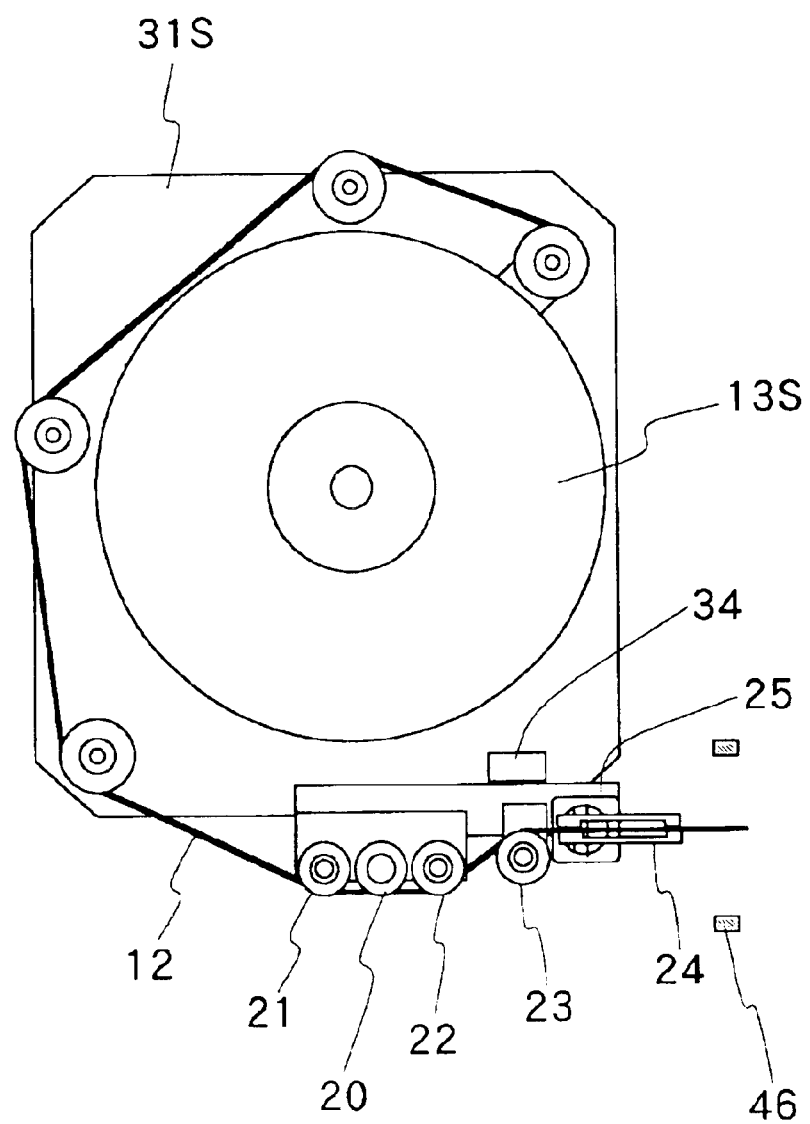
FIG. 14 is a schematic illustration explanatory of a fifth step of the ACF tape end connecting operation.

Then, as shown in FIG. 14, the drawing chuck member 24 is closed to grip the ACF tape 12, and succeedingly the handover chuck member 46 is opened to release the ACF tape 12. As a consequence, the fore end of the ACF tape 12 from the supply reel 13S is now gripped by the drawing chuck member 24, that is to say, the ACF tape from the supply reel 13S is now connected to the bonding means 18. Thus, the machine is ready to start the operation of bonding the ACF 10 on a lower substrate of a liquid crystal cell.

As described above, the replacement of the supply reel 13, which is necessary for the ACF bonding machine to continue the AFC bonding operation continuously in an uninterrupted manner, can be carried out in an arbitrary timing which is convenient to the operator, and a fore end of an ACF tape from a fresh supply reel is connected to the bonding means 18 automatically without requiring manual labor of an operator as soon as an ACF tape from a currently operating supply reel is completely consumed. The combination of the manual reel replacement and the automatic tape connecting operation makes it possible to carry out required jobs speedily and efficiently, suppressing time losses to a minimum. It becomes unnecessary for the operator to stand by and wait for reel replacement. Accordingly, in automatically mounting driver electronics parts on liquid crystal cells 1, the operation can be carried out at an accelerated tact time, let alone improvements in working efficiency of the operator who is required to attend to various jobs.

What is claimed is:

1. A method of continuously feeding ACF tapes one after another from supply reels set in a feed position and a standby position on a reel stand, continuing ACF tape feed by automatically switching a fresh supply reel from said standby position to said feed position as soon as an ACF tape on a supply reel in said feed position has been consumed to a tape end, said method comprising the steps of:

withdrawing an ACF tape, with an ACF laminated on a liner tape, from a supply reel in said feed position on said reel stand by the use of a drawing chuck member, and bonding said ACF repeatedly on a substrate by the use of a bonding roller while peeling off said liner tape from said ACF by the use of a peeling roller;

setting a fresh supply reel in said standby position at an arbitrary time point during an ACF bonding operation and letting a tape end holder member grip by suction force a leading end portion of an ACF tape from said fresh reel;

as soon as said supply reel in said feed position is consumed to a tape end, turning said reel stand to switch reel positions from said feed position to standby position or vice verse, bringing said fresh supply reel to said feed position; and handing said leading end portion of said ACF tape on said tape end holder member over to said drawing chuck member, routing said ACF tape under said bonding roller and over said peeling roller.

2. A method of continuously feeding ACF tapes as defined in claim 1, wherein ACF supply reels are set on reel mount members on opposite sides of said reel stand, which reel stand being turnable through 180 degrees about a reversing shaft at the time of switching said reel positions from said feed position to said standby position or vice versa.

3. A method of continuously feeding ACF tapes as defined in claim 1, wherein said drawing chuck member is movable up and down and reciprocable back and forth in a travel direction of said ACF tape for receiving and gripping said fore end portion of said ACF tape from said tape end holder member, and said ACF is removed from said fore end portion of said ACE tape up to a point coming just past said peeling roller at the time of handover of said ACF tape to said drawing chuck member.

4. An ACF (Anisotropic Conductive Film) tape feeder machine for feeding ACF tapes, each with an ACF laminated on a liner tape, from an ACF tape feeding station to a bonding means for bonding said ACE on substrate plate surfaces one after another in a predetermined length, said ACF tape feeder machine comprising:

an ACF tape feeding station having at least two reel mount members on a reel stand for setting at least two supply reels on said reel stand, one in a feed position and the other one in a standby position, a tape end holder member provided in association with each reel mount member for temporarily holding a fore end portion of an ACF tape from said supply reel, a switch means for switching positions of said supply reels, one supply reel from said feed position to said standby position and the other supply reel from said standby position to said feed position when said one supply reel has been consumed to a tape end;

a bonding means including a drawing chuck member adapted to grip a leading end portion of said ACF tape reeled out from said reel stand, a bonding roller adapted to press said liner tape against a substrate plate, and a peeler roller adapted to peel off said liner tape from an ACF bonded on said substrate plate;

a tape handover means adapted to pick up said leading end portion of said ACF tape from said tape end holder member and to hand the same over to said drawing chuck member after passing said ACF tape through a path under said bonding roller and over said peeler roller.

5. An ACF tape feeder machine as defined in claim 4, wherein said bonding means bonds ACF on electrode groups on a transparent substrate plate for connecting driver electronics to said electrode groups through said ACF by TAP (Tape Automated Bonding).

6. An ACF tape feeder machine as defined in claim 4, wherein said reel mount members are provided back to back on the opposite sides of said reel stand along with said associated tape end holder member, and a plurality of guide rollers.

7. An ACF tape feeder machine as defined in claim 4, wherein said tape end holder member is adapted to grip a liner tape portion of said ACF tape by suction force.

8. An ACF tape feeder machine as defined in claim 4, wherein said bonding means is arranged to reciprocate between bonding start and end positions on said substrate plate, and provided with a drive means for movements between said bonding start position and said tape end holder member.

9. An ACF tape feeder machine as defined in claim 4, wherein said switching means includes a reversing shaft connected to said reel stand and a reversible drive means rotationally coupled with said reserving shaft for reversing positions of said reel mount members.

10. An ACF tape feeder machine as defined in claim 4, wherein said tape handover means includes a handover chuck member, a lift member movable up and down and reciprocable back and forth over a predetermined stroke length in a travel direction of said ACF tape to chuck a leading end portion of said ACF tape in said tape end holder member and hand said ACF tape over to said drawing chuck member.

11. An ACF tape feeder machine as defined in claim 10, wherein an ACF is removed from a leading portion of said ACF tape in said tape end holder member between said peeling roller of said bonding means and said drawing chuck member at the time of handover from said handover chuck member to said drawing chuck member.

* * * * *